United States Patent
Zhang

(10) Patent No.: US 8,242,841 B2
(45) Date of Patent: Aug. 14, 2012

(54) RECEIVER HAVING MULTI-STAGE LOW NOISE AMPLIFIER

(75) Inventor: Liping Zhang, Torrance, CA (US)

(73) Assignee: CSR Technology Inc., San Jose, CA (US)

( * ) Notice: Subject to any disclaimer, the term of this patent is extended or adjusted under 35 U.S.C. 154(b) by 664 days.

(21) Appl. No.: 12/328,969

(22) Filed: Dec. 5, 2008

(65) Prior Publication Data
US 2010/0141341 A1    Jun. 10, 2010

(51) Int. Cl.
H03F 3/45 (2006.01)
H04B 1/18 (2006.01)

(52) U.S. Cl. ......... 330/254; 330/302; 455/280; 455/291

(58) Field of Classification Search ............... 455/280, 455/291; 330/254, 302
See application file for complete search history.

(56) References Cited

U.S. PATENT DOCUMENTS

| | | | |
|---|---|---|---|
| 5,012,244 A | 4/1991 | Wellard et al. | |
| 5,289,420 A | 2/1994 | Neu | |
| 6,111,606 A | 8/2000 | Ikeda | |
| 6,316,997 B1 * | 11/2001 | Tammone, Jr. | 330/254 |
| 6,411,892 B1 | 6/2002 | Van Diggelen | |
| 6,417,801 B1 | 7/2002 | Van Diggelen | |
| 6,429,814 B1 | 8/2002 | Van Diggelen et al. | |
| 6,453,237 B1 | 9/2002 | Fuchs et al. | |
| 6,484,097 B2 | 11/2002 | Fuchs et al. | |
| 6,487,499 B1 | 11/2002 | Fuchs et al. | |
| 6,510,387 B2 | 1/2003 | Van Diggelen | |
| 6,542,820 B2 | 4/2003 | LaMance et al. | |
| 6,560,534 B2 | 5/2003 | Abraham et al. | |
| 6,583,661 B1 * | 6/2003 | Tanji et al. | 330/254 |
| 6,606,346 B2 | 8/2003 | Abraham et al. | |
| 6,677,735 B2 | 1/2004 | Xi | |
| 6,704,651 B2 | 3/2004 | Van Diggelen | |
| 7,075,374 B2 * | 7/2006 | Revanna | 330/302 |
| 7,084,707 B2 * | 8/2006 | Razavi et al. | 330/302 |
| 7,173,460 B2 | 2/2007 | Jaussi et al. | |
| 7,474,158 B1 * | 1/2009 | Yim et al. | 330/311 |
| 7,486,135 B2 * | 2/2009 | Mu | 330/51 |
| 7,782,136 B2 * | 8/2010 | Kocaman et al. | 330/254 |
| 7,839,218 B2 * | 11/2010 | Shimamoto et al. | 330/298 |
| 7,860,454 B2 * | 12/2010 | Moloudi et al. | 455/20 |
| 7,983,637 B2 * | 7/2011 | Kayano | 455/127.2 |
| 7,986,927 B2 * | 7/2011 | Nakajima et al. | 455/127.4 |
| 7,994,878 B2 * | 8/2011 | Isobe et al. | 333/195 |
| 7,995,977 B2 * | 8/2011 | Kim et al. | 455/127.2 |

* cited by examiner

Primary Examiner — Kenneth B. Wells
(74) Attorney, Agent, or Firm — K&L Gates LLP

(57) ABSTRACT

A receiver having multi-stage low noise amplifier are provided. In this regard, a representative receiver, among others, includes at least one antenna and a filter that receives and filters signals from the at least one antenna. The filtered signals include a first frequency band signal and a second frequency band signal. The receiver further includes a multi-stage low noise amplifier that receives the filtered signals from the filter. The multi-stage low noise amplifier includes a first stage low noise amplifier that receives and performs impedance matching for the first frequency band signal and second frequency band signal. The multi-stage low noise amplifier further includes a second stage low noise amplifier that receives the first frequency band signal and second frequency band signal. The second stage low noise amplifier includes load resistors that switch off for the first frequency band signal and switch on for the second frequency band signal based on receiving either the first frequency band signal or second frequency band signal.

20 Claims, 5 Drawing Sheets

RECEIVER HAVING MULTI-STAGE LOW NOISE AMPLIFIER

TECHNICAL FIELD

The present disclosure relates to low noise amplifiers, and more particularly, the disclosure relates to multi-stage low noise amplifier that optimizes the receiver performance, e.g., either noise figure or linearity, or both.

BACKGROUND

Digital video broadcasting (DVB) is becoming more popular as technology improves for digital television. DVB uses multiple ways of distributing data, such as, satellite, cable, terrestrial television, digital terrestrial television for handhelds, and microwave signals. Many DVB systems use receivers and rely on the performance of the receivers to operate at a satisfactory level. One of the common components in the receivers is a low noise amplifier, the design of which can be improved to obtain better noise figure and linearity of the receiver.

SUMMARY

A receiver having multi-stage low noise amplifier is provided. In this regard, a representative receiver, among others, includes at least one antenna and a filter that receives and filters signals from the at least one antenna. The filtered signals include a first frequency band signal and a second frequency band signal. The receiver further includes a multi-stage low noise amplifier that receives the filtered signals from the filter. The multi-stage low noise amplifier includes a first stage low noise amplifier that receives and performs impedance matching for the first frequency band signal and second frequency band signal. The multi-stage low noise amplifier further includes a second stage low noise amplifier that receives the first frequency band signal and second frequency band signal. The second stage low noise amplifier includes load resistors that switch off for the first frequency band signal and switch on for the second frequency band signal based on receiving either the first frequency band signal or second frequency band signal.

The present invention can also be viewed as providing methods for providing a receiver having multi-stage low noise amplifier. In this regard, one embodiment of such a method, among others, can be broadly summarized by the following steps: connecting at least one antenna to a filter that receives and filters signals from the at least one antenna, the filtered signals including a first frequency band signal and a second frequency band signal; connecting the filter to a multi-stage low noise amplifier that receives the filtered signals from the filter; performing impedance matching for the first frequency band signal and second frequency band signal by a first stage low noise amplifier of the multi-stage low noise amplifier; sending the first frequency band signal and second frequency band signal to a second stage low noise amplifier, the second stage low noise amplifier including load resistors that switch off for the first frequency band signal and switch on for the second frequency band signal; and switching on or off the load resistors based on receiving either the first frequency band signal or second frequency band signal.

Other systems, methods, features, and advantages of the present invention will be or become apparent to one with skill in the art upon examination of the following drawings and detailed description.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Exemplary systems are first discussed with reference to the figures. Although these systems are described in detail, they are provided for purposes of illustration only and various modifications are feasible.

Figure 1:
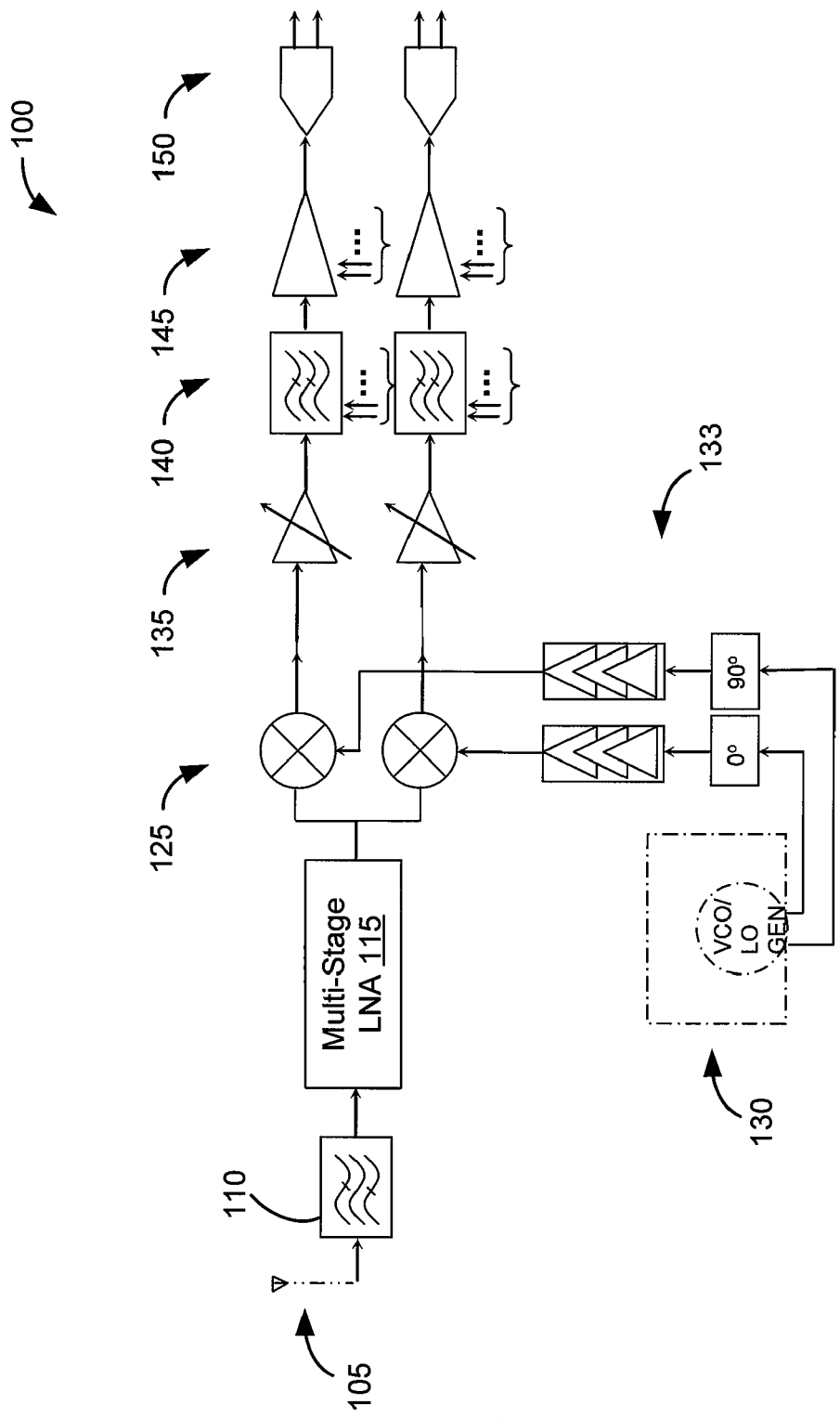
FIG. 1 is a schematic drawing that illustrates an embodiment of a receiver having a multi-stage low noise amplifier.

FIG. 1 is a schematic drawing that illustrates an embodiment of a receiver 100 having a multi-stage low noise amplifier. The receiver 100 includes at least one antenna 105 that is electrically connected to a filter 110, such as a multi-band select SAW filter. The filter 110 receives and filters the signals from the antenna 105. The filtered signals are sent to a multi-stage low noise amplifier 115 that amplifies the filtered signals and sends the amplified signals to mixers 125. A frequency synthesizer 130, such as a wide band voltage-controlled oscillator and/or local oscillator generator, generates and sends controlled frequency signals to phase shifters 133 that shift the phase of the controlled frequency signals to 0 degrees or 90 degrees.

The phase shifters 133 send the phase shifted signals to the mixers 125. Each mixer 125 combines the respective phased shifted signals into one composite output signal and sends the respective combined signals to respective intermediate frequency (IF) amplifiers 135, each of which amplifies the respective combined signals and sends them to low pass filters 140. Such low pass filters 140 pass low-frequency signals from the respective combined signals to respective programmable gain amplifier 145; but attenuate signals with frequencies higher than a cutoff frequency. The programmable gain amplifiers 145 amplify the respective filtered low-frequency signals and send the signals to analog-to-digital converters 150.

Figure 2:
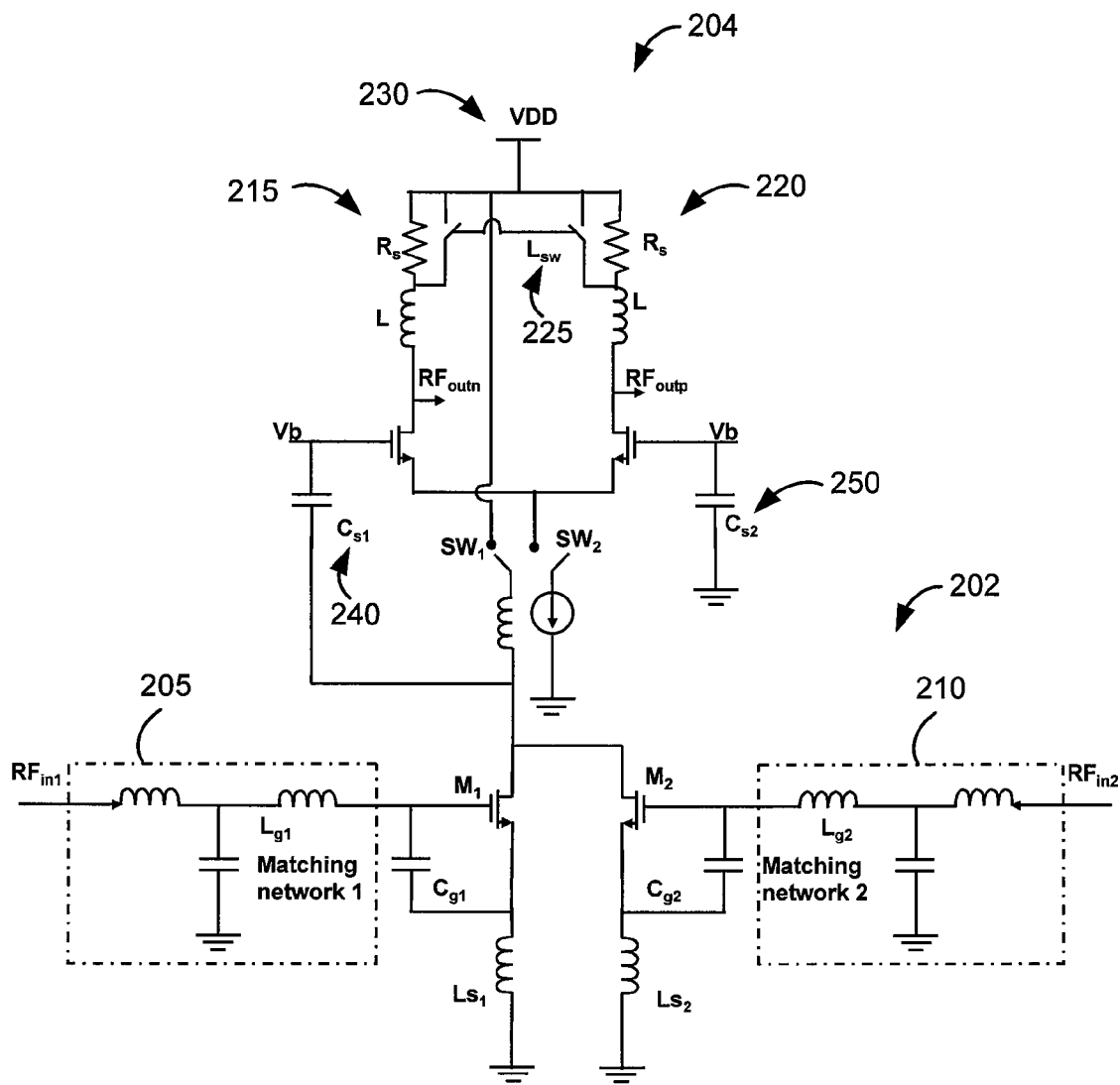
FIG. 2 is a schematic drawing that illustrates an embodiment of a first stage low noise amplifier and second stage low noise amplifier of the multi-stage low noise amplifier, such as that shown in FIG. 1.

FIG. 2 is a schematic drawing that illustrates an embodiment of a first stage low noise amplifier and second stage low noise amplifier of the multi-stage low noise amplifier 115, such as that shown in FIG. 1, and are denoted generally by reference numerals 202, 204, respectively. The first stage low noise amplifier 202 can be electrically connected to a SAW filter 110 that selects UHF/VHF and L-band signals. The filter 110 sends the UHF/VHF and L-band signals to the first stage low noise amplifier 202 at RFin1 and RFin2, respectively. The first stage low noise amplifier 202 includes two matching networks 205, 210 that receive and perform impedance matching for the UHF/VHF and L-band signals from the filter 110. The matching networks 205, 210 send the matching signals to input transistors (M1 and M2) that can be individually shut down through bandgap current supply.

Cs1 240 and Cs2 250 are inter-stage alternating current coupling capacitors. The single-ended to differential-ended conversion can be performed from the first stage low noise amplifier 202 to second stage low noise amplifier 204. The first stage low noise amplifier 202 can reuse the current from the second stage low noise amplifier 120 based on whether interferers are detected (preferably zero or little interference). If interferers are detected, the first stage and second stage low noise amplifiers 202, 204 can use separate power supply; thus achieving higher linearity. The second stage low noise amplifier 204 receives and detects the first frequency band signal and second frequency band signal. The load resistors Rs 215, 220 can switch off for L-band signal path and switch on for UHF/VHF signal path based on receiving either the L-band signal or UHF/VHF signal, respectively. The second stage low noise amplifier 204 outputs L-band signal path and UHF/VHF signal path at RFoutn and RFoutp, respectively.

Figure 3:
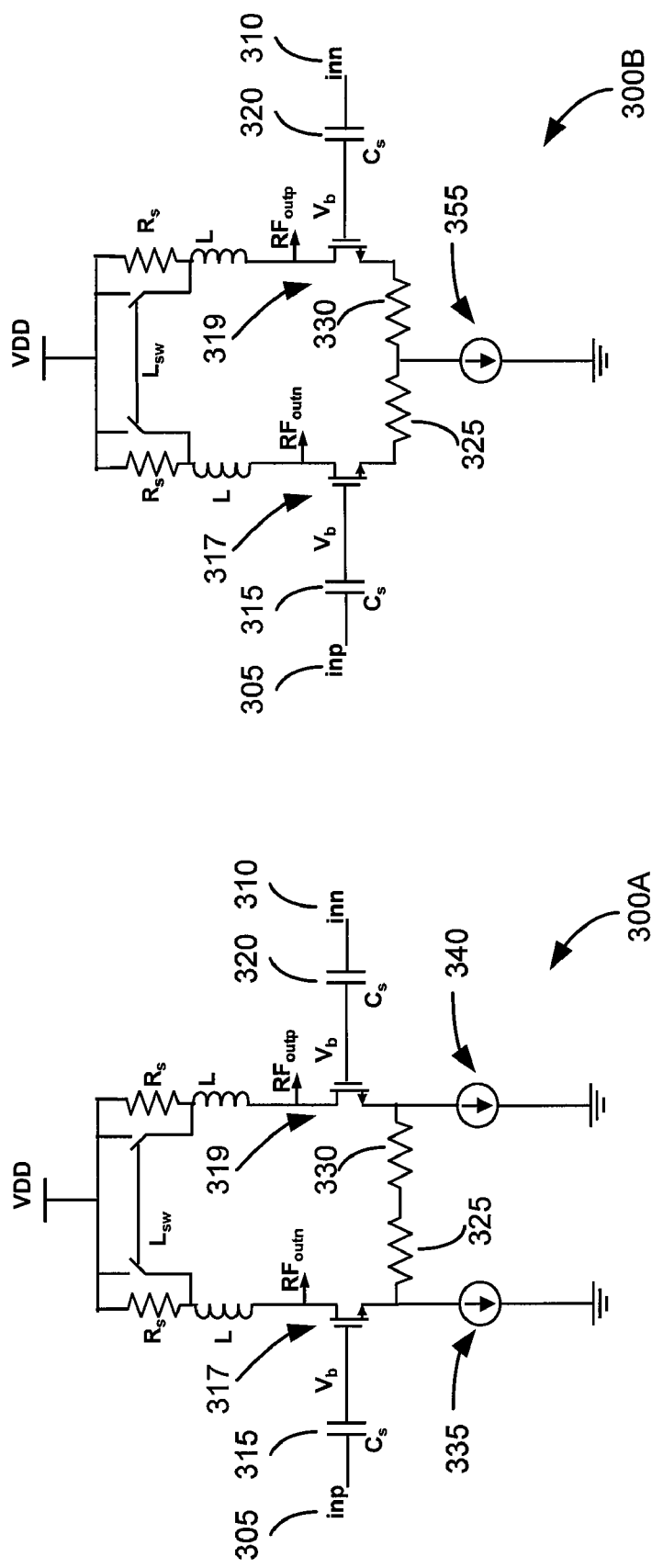
FIGS. 3A-B are schematic drawings that illustrate embodiments of a third stage low noise amplifier of the multi-stage low noise amplifier, such as that shown in FIG. 1.

FIGS. 3A-B are schematic drawings that illustrate embodiments of a third stage low noise amplifier of the multi-stage low noise amplifier 115, such as that shown in FIG. 1, and are denoted generally by reference numerals 300A-B, respectively. The third stage low noise amplifiers 300A-B include alternating current coupling capacitors 315, 320 at differential inputs 305, 310 that are electrically connected to transistors 317, 319, respectively. The differential inputs 305, 310 receive signals from RFoutp and RFoutn of the second stage low noise amplifier 204 (FIG. 2), respectively. The third stage low noise amplifiers 300A-B further include resistors 325, 330 that are electrically connected in series between the transistors 317, 319. The circuit topologies in FIGS. 3A-B further include load resistors Rs that are connected to the transistors 317, 319 and VDD. The load resistors Rs operate similarly to the load resistors Rs in FIG. 2 and thus can be switched on and off based on receiving the UHF/VHF band signal and the L-band signal, respectively.

In FIG. 3A, current sources 335, 340 are electrically connected between transistor 317 and resistor 325, and between transistor 319 and resistor 330, respectively. In FIG. 3B, a current source 355 is electrically connected between the resistors 325, 330. The circuit topology in FIG. 3A optimizes linearity and the circuit topology in FIG. 3B optimizes noise performance.

Figure 4:
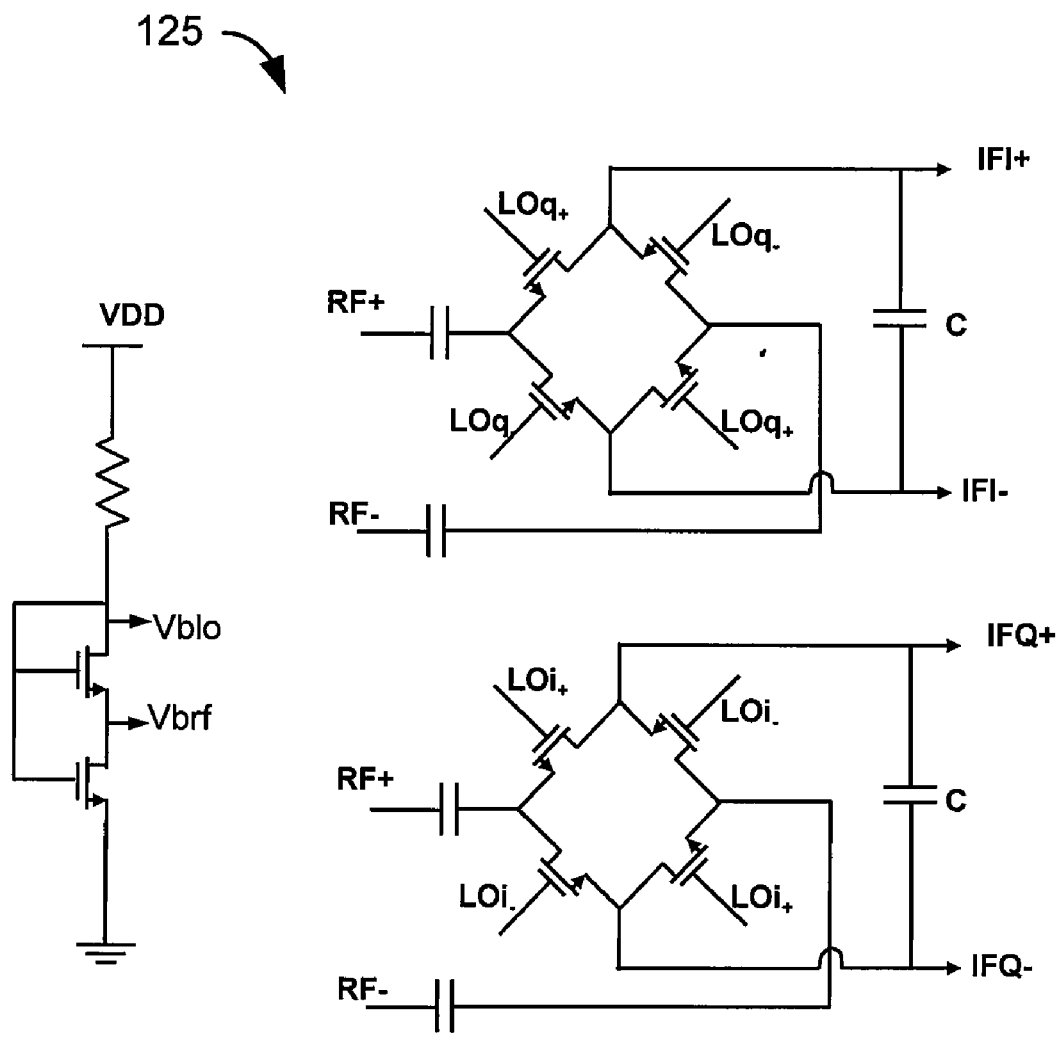
FIG. 4 is a schematic drawing that illustrates an embodiment of a mixer, such as that shown in FIG. 1.

FIG. 4 is a schematic drawing that illustrates an embodiment of a mixer, such as that shown in FIG. 1, and is denoted generally by reference numeral 125. In this example, the mixer 125 is an IQ image rejection mixer for frequency down conversion and the image attenuation. The mixer 125 is a passive ring mixer, same for both I and Q. Signals at LOi lead signals at LOq 90 degrees, and signals at IFI lead signals at IFQ by 90 degrees in phase. Vblo is the bias voltage of the local oscillator port, and Vbrf is the bias voltage for the RF input port. The IF port is biased by the following stages: from LO to RF bias, there can be one threshold voltage drop over process, voltage and temperature variation, potentially achieving the optimal linearity and noise figure performance. The IF output capacitor with the resistive load forms a first order low pass filter, to filter out the band high frequency harmonics.

Figure 5:
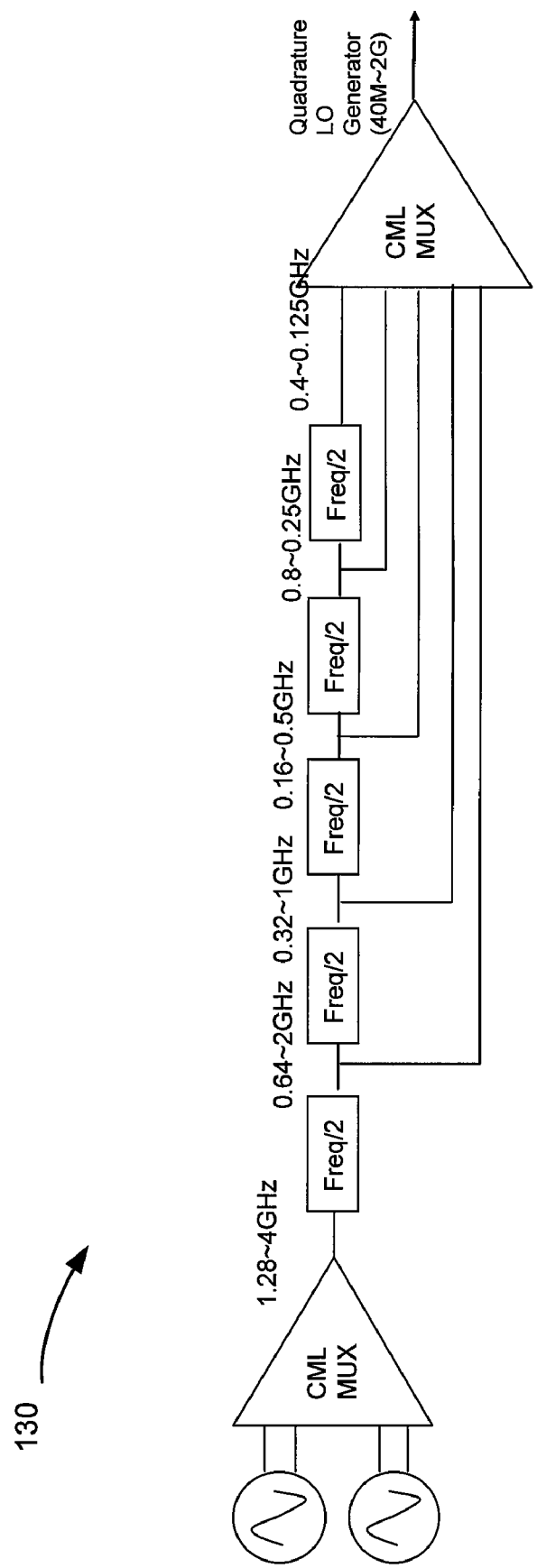
FIG. 5 is a schematic drawing that illustrates an embodiment of a frequency synthesizer, such as that shown in FIG. 1.

FIG. 5 is a schematic drawing that illustrates an embodiment of a frequency synthesizer, such as that shown in FIG. 1, and is denoted generally by reference numeral 130. A receiver, such as a digital video broadcasting (DVB), can cover UHF band, VHF band and L band and so the frequency synthesizer can be designed to generate signals with frequencies from 40 MHz to 1.8 GHz. In this example, the frequency synthesizer is a two wideband voltage-controlled oscillator that generates signals with frequencies ranging from 1.2G to 2.4G and the other signals with frequencies ranging from 2.3 to 4 GHz. Further, depending on the receiver input band, one set of signals of the voltage-controlled oscillator can be on and the other can be off. The outputs of the two voltage-controlled oscillator are combined through a higher frequency current mode logic (CML driver) into a single differential output, which is then followed by a cascade of frequency divide-by-2 circuits to obtain all the frequencies. The last stage is a CML multiplexer to select the desired local oscillator frequency.

This description has been presented for purposes of illustration and description. It is not intended to be exhaustive or to limit the disclosure to the precise forms disclosed. Obvious modifications or variations are possible in light of the above teachings. The embodiments discussed, however, were chosen to illustrate the principles of the disclosure, and its practical application. The disclosure is thus intended to enable one of ordinary skill in the art to use the disclosure, in various embodiments and with various modifications, as is suited to the particular use contemplated. All such modifications and variations are within the scope of this disclosure, as determined by the appended claims when interpreted in accordance with the breadth to which they are fairly and legally entitled.

What is claimed:

1. A receiver having a multi-stage low noise amplifier comprising:
at least one antenna;
a filter that receives and filters signals from the at least one antenna, the filtered signals including a first frequency band signal in a first frequency band and a second frequency band signal in a second frequency band; and
a multi-stage low noise amplifier that receives the filtered signals from the filter, the multi-stage low noise amplifier including a first stage low noise amplifier that receives and performs impedance matching for the first frequency band signal and the second frequency band signal, the multi-stage low noise amplifier further including a second stage low noise amplifier that receives the first frequency band signal and the second frequency band signal, the second stage low noise amplifier including load resistors that are bypassed when the first frequency band signal is within the first frequency band and are not bypassed when the second frequency band signal is within the second frequency band based on receiving either the first frequency band signal or the second frequency band signal by the second stage low noise amplifier.

2. The receiver as defined in claim 1, wherein the first stage low noise amplifier achieves impedance matching by way of matching networks, which send matching signals to input transistors that individually shut down through bandgap current supply.

3. The receiver as defined in claim 1, further comprising inter-stage alternating current coupling capacitors between the first and second stage low noise amplifiers.

4. The receiver as defined in claim 1, wherein the first stage low noise amplifier reuses current from the second stage low noise amplifier based at least upon on whether interferers are detected.

5. The receiver as defined in claim 4, wherein the first stage and second stage low noise amplifiers use separate power supplies based on the detected interferers.

6. The receiver as defined in claim 1, wherein the multi-stage low noise amplifier further includes a third stage low noise amplifier that includes alternating current coupling capacitors at differential inputs that are electrically connected to transistors, respectively, the differential inputs receiving the first and second frequency band signals from the second stage low noise amplifier, the third stage low noise amplifier further including load resistors that are bypassed when the first frequency band signal is within the first frequency band and are not bypassed when the second frequency band signal is within the second frequency band based on receiving either the first frequency band signal or second frequency band signal by the third stage low noise amplifier.

7. The receiver as defined in claim 6, wherein the third stage low noise amplifier further includes resistors that are electrically connected in series between the transistors and current sources that are electrically connected between the transistors and resistors, respectively.

8. The receiver as defined in claim 6, wherein the third stage low noise amplifier further includes resistors that are electrically connected in series between the transistors and a current source that is electrically connected between the resistors that are electrically connected in series between the transistors.

9. A method for providing a receiver having multi-stage low noise amplifier, the method comprising:
connecting at least one antenna to a filter that receives and filters signals from the at least one antenna, the filtered signals including a first frequency band signal in a first frequency band and a second frequency band signal in a second frequency band;
connecting the filter to a multi-stage low noise amplifier that receives the filtered signals from the filter;
performing impedance matching for the first frequency band signal and the second frequency band signal using a first stage low noise amplifier of the multi-stage low noise amplifier;
sending the first frequency band signal and the second frequency band signal to a second stage low noise amplifier, the second stage low noise amplifier including load resistors that are bypassed when the first frequency band signal is within the first frequency band and are not bypassed when the second frequency band signal is within the second frequency band; and
bypassing or not bypassing the load resistors based on receiving either the first frequency band signal or the second frequency band signal by the second stage low noise amplifier.

10. The method as defined in claim 9, further comprising sending the matching signals to input transistors that individually shut down through bandgap current supply.

11. The method as defined in claim 9, further comprising connecting inter-stage alternating current coupling capacitors between the first and second stage low noise amplifiers.

12. The method as defined in claim 9, further comprising reusing current from the second stage low noise amplifier based at least upon on whether interferers are detected.

13. The method as defined in claim 12, further comprising using separate power supplies by for the first stage and second stage low noise amplifiers based on the detected interferers.

14. The method as defined in claim 9, further comprising:
connecting a third stage low noise amplifier that includes alternating current coupling capacitors at differential inputs that are electrically connected to transistors, respectively, the differential inputs receiving the first and second frequency band signals from the second stage low noise amplifier, the third stage low noise amplifier further including load resistors that are bypassed when the first frequency band signal is within the first frequency band and are not bypassed when the second frequency band signal is within the second frequency band; and
bypassing or not bypassing the load resistors of the third stage low noise amplifier based on receiving either the first frequency band signal or the second frequency band signal by the third stage low noise amplifier.

15. The method as defined in claim 14, further comprising:
connecting resistors in series between the transistors of the third stage low noise amplifier; and
connecting current sources between the transistors and resistors of the third stage low noise amplifier, respectively.

16. The method as defined in claim 14, further comprising:
connecting resistors in series between the transistors of the third stage low noise amplifier;
and connecting a current source between the resistors of the third stage low noise amplifier.

17. A multi-stage low noise amplifier comprising:
a first stage low noise amplifier that receives and performs impedance matching for a first frequency band signal in a first frequency band and a second frequency band signal in a second frequency band; and
a second stage low noise amplifier that receives the first frequency band signal and the second frequency band signal, the second stage low noise amplifier including load resistors that are bypassed when the first frequency band signal is within the frequency band and are not bypassed when the second frequency band signal is within the second frequency band based on receiving either the first frequency band signal or second frequency band signal by the second stage low noise amplifier.

18. The multi-stage low noise amplifier as defined in claim 17, further comprising a third stage low noise amplifier that includes alternating current coupling capacitors at differential inputs that are electrically connected to transistors, respectively, the differential inputs receiving the first and second frequency band signals from the second stage low noise amplifier, the third stage low noise amplifier further including load resistors that are bypassed when the first frequency band signal is within the first frequency band and are not bypassed when the second frequency band signal is within the second frequency band based on receiving either the first frequency band signal or the second frequency band signal by the third stage low noise amplifier.

19. The multi-stage low noise amplifier as defined in claim 17, wherein the third stage low noise amplifier further includes resistors that are electrically connected in series between the transistors and current sources that are electrically connected between the transistors and resistors, respectively.

20. The multi-stage low noise amplifier as defined in claim 17, wherein the third stage low noise amplifier further includes resistors that are electrically connected in series between the transistors and a current source that is electrically connected between the resistors that are electrically connected in series between the transistors.

* * * * *

UNITED STATES PATENT AND TRADEMARK OFFICE
CERTIFICATE OF CORRECTION

PATENT NO. : 8,242,841 B2
APPLICATION NO. : 12/328969
DATED : August 14, 2012
INVENTOR(S) : Liping Zhang It is certified that error appears in the above-identified patent and that said Letters Patent is hereby corrected as shown below:

Column 3, line 58, delete "the"

Column 5, line 59, delete "by"

Signed and Sealed this
Fifth Day of February, 2013

Teresa Stanek Rea
*Acting Director of the United States Patent and Trademark Office*